(12) United States Patent
Gunturi et al.

(10) Patent No.: US 7,538,436 B2
(45) Date of Patent: May 26, 2009

(54) PRESS PACK POWER SEMICONDUCTOR MODULE

(75) Inventors: Satish Gunturi, Baden-Dättwil (CH); Daniel Schneider, Zürich (CH)

(73) Assignee: ABB Research Ltd, Zurich (CH)

( * ) Notice: Subject to any disclaimer, the term of this patent is extended or adjusted under 35 U.S.C. 154(b) by 108 days.

(21) Appl. No.: 10/527,993

(22) PCT Filed: Sep. 29, 2003

(86) PCT No.: PCT/CH03/00646

§ 371 (c)(1),
(2), (4) Date: Oct. 17, 2005

(87) PCT Pub. No.: WO2004/030093

PCT Pub. Date: Apr. 8, 2004

(65) Prior Publication Data

US 2006/0118816 A1     Jun. 8, 2006

(30) Foreign Application Priority Data

Sep. 27, 2002   (EP) .................................. 02405836

(51) Int. Cl.
*H01L 23/48* (2006.01)
(52) U.S. Cl. .............................. 257/773; 257/E23.074
(58) Field of Classification Search ................. 257/119, 257/773, E23.074; 428/367
See application file for complete search history.

(56) References Cited

U.S. PATENT DOCUMENTS

| 3,770,488 | A | * | 11/1973 | Pepper et al. ................ 427/299 |
| 4,196,442 | A | * | 4/1980 | Kuniya et al. ................ 257/746 |
| 4,403,242 | A | * | 9/1983 | Tsuruoka ..................... 257/773 |
| 4,482,912 | A | * | 11/1984 | Chiba et al. .................. 257/746 |
| 5,437,921 | A | | 8/1995 | Kogo et al. |
| 5,944,097 | A | * | 8/1999 | Gungor et al. ............... 165/185 |
| 6,320,268 | B1 | | 11/2001 | Lang et al. |
| 6,426,561 | B1 | * | 7/2002 | Lang et al. .................. 257/779 |
| 2001/0017377 | A1 | * | 8/2001 | Ikuhashi ..................... 257/119 |

FOREIGN PATENT DOCUMENTS

| DE | 37 31 624 | 3/1989 |
| DE | 38 38 968 | 7/1989 |
| EP | 0 12 019 | 6/1980 |
| EP | 0 049 791 | 4/1982 |
| JP | 59 021033 | 2/1984 |
| JP | 4 015985 | 1/1992 |
| JP | 2000 303155 | 10/2000 |

* cited by examiner

*Primary Examiner*—Thomas L Dickey
(74) *Attorney, Agent, or Firm*—Buchanan Ingersoll & Rooney PC

(57) ABSTRACT

The high-power pack semiconductor module (1) comprises a layer (3, 4), which is brought into direct contact with one or both of the main electrodes of the Si semiconductor chip, (2), said layer being made of a metal matrix composite material whose coefficient of thermal expansion can be tailored to a value either close or matching that of Si.

9 Claims, 1 Drawing Sheet

PRESS PACK POWER SEMICONDUCTOR MODULE

BACKGROUND OF THE INVENTION

The present invention relates to the technical field of power electronics. It concerns a high-power press pack semiconductor module, in particular an IGBT (Insulated Gate Bipolar Transistor) or a Thyristor module.

BACKGROUND ART

Press pack modules comprising either Thyristor or IGBT semiconductor devices are used in the field of power electronics for switching applications as in HVDC-converters (high voltage direct current converters). In order to achieve higher blocking voltages than with individual devices press pack modules are stacked in series on top of each other. Pressure is applied to that stack to assure proper electrical and thermal contact between the individual press pack modules.

In case of a defect in one of the pressure-contacted semiconductor devices of such a stack, the Si (silicon) chip of the semiconductor device first melts locally, as current flows, forming a conductive channel (hot spot) over the entire thickness of the device. The faulty semiconductor device ideally forms a stable short circuit and takes the entire rated current of the stack. Redundant semiconductor devices introduced in the stack take the additional load due to failure of the defective device. A single defective device will therefore not lead to failure of the entire stack. The defective device will remain in the stack until it is replaced in course of regular maintenance work.

Short circuit failure mode (SCFM) occurs in standard Thyristor press packs, where the large Si area of the semiconductor chip sandwiched between Mo (molybdenum) plates, along with hermetic sealing of the package aids in maintaining a relatively stable compound that forms the short circuit.

However, in the case of press packs that are not hermetically sealed and utilize IGBTs with a smaller area of mechanical contact, the short circuit that is formed is not stable enough due to a variety of reasons concerning oxidation, fast consumption of the hotspot alloy (and hence the Si semiconductor chip) due to aging, metallurgical incompatibility to name a few.

A new power semiconductor module with further improved SCFM (short circuit failure mode) behavior is introduced in U.S. Pat. No. 6,426,561. A metallic layer composed of a suitable material is brought into direct contact with one or both of the main electrodes of the Si semiconductor chip. The material of this metallic layer forms a eutectic mixture with Si. In the event of a defect, the entire sandwich structure is heated and, once the melting point of the eutectic mixture is reached, a conductive melt starts to form on the contact surface between said layer and the Si. This melting zone will then expand over the entire thickness of the Si semiconductor chip, forming a metallically conductive channel, which provides a more stable hotspot and hence longer SCFM life of the module.

However, under normal operating conditions at high power ratings that give rise to higher temperature gradients in the semiconductor devices, the introduction of a metallic layer in contact with the chip raises the problem of thermo-mechanical fatigue (also known as intermittent operating load, IOL) and fretting due to thermal cycling and differences in the coefficients of thermal expansion (CTE) between the Si semiconductor chip and the metallic layer in contact. This could potentially result in early failure of the Si semiconductor chip.

U.S. Pat. No. 4,196,442 describes a semiconductor device in which the semiconductor substrate is bonded on at least one electrode surface to a supporting electrode, which is a composite body comprising of graphite fibers embedded in an electrically conductive matrix. The patent describes the advantages derived from using an annular configuration of the fibers to attain the required CTE match with the semiconductor substrate and discourages the use of a 2 dimensional random arrangement of short fibers due to problems encountered with bulging upon heating to 300° C. The metallic matrix in this case comprises of mainly of Cu with carbide forming elements, while alloys of Al, Ag and their alloys are mentioned to be also suitable.

SUMMARY OF THE INVENTION

Accordingly, it is an object of the present invention to provide a novel high-power press pack semiconductor module, which meets both intermittent operating load and short circuit failure mode requirements while at the same time possessing better mechanical properties to withstand creep at high temperatures This object is achieved by a high-power press pack semiconductor module with the features of the independent claim.

According to the invention, the high-power press pack semiconductor module comprises a layer, which is brought into direct contact with one or both of the main electrodes of the Si semiconductor chip, said layer being made of a MMC (metal matrix composite) material utilising two-dimensional, in the plane of the contact interface randomly oriented short graphite fibers whose CTE can be tailored to a value either close to or matching that of Si.

The inventive module has an enhanced IOL capability due to CTE compatibility with the semiconductor and reduced power dissipation during normal operation when MMCs with higher thermal conductivities are used. It also has improved SCFM performance due to reduced power dissipation in the hotspot. Even if bowing in the plates occurs either during manufacture or during assembly processes (involving heating to facilitate bonding processes for eg soldering), the bow is flattened out by the use of a matrix comprising of Al or Ag and their alloys, under the pressure that the stack is subjected to in service giving a good contact between the interfaces involving the composite material.

Due to the metal matrix composite material the press pack semiconductor module has also enhanced mechanical strength and creep resistance compared with pure metallic materials that form the matrix, thus improving the reliability of the module in service.

In order to further improve on SCFM requirement where the entire rated current of a stack is to be taken up by the short circuit formed by the hotspot alloy and to give rise to a more stable and longer operational time of the semiconductor module, metal matrix composites with high metallic content that can easily alloy with the Si from the chip and form eutectics are preferably to be used.

The same composite material (eg. Al-graphite) can be used on either side of the Si semiconductor chip, resulting in a continuous current carrying path due to joining/bonding of the materials under SCFM conditions. As the same material is used on either side the possibility of forming deleterious metallurgical phases, e.g. intermetallics with low thermal and electrical conductivities is minimized.

However, under conditions where power dissipation is low and hence the rate of formation of intermetallics is also low, two different composites or a combination of a metal with matching CTE on one side and a composite on the other can be used.

In order to obtain an adequate electrical contact between the main electrodes of the Si semiconductor chip and the metallic contact surfaces the contact surfaces on either side of the Si semiconductor chip can either be freely floating or bonded to the chip by a variety of techniques (soldering, sintering using metallic powders, diffusion bonding or conducting adhesives).

Metal matrix composites base and top plates comprising Al-graphite have proven to be easier and cheaper to produce than materials used for conventional substrates and contacting plates.

In order to improve contact properties and friction, contacting surfaces of the Si semiconductor chip and the metal matrix composite layers can be plated with conventional materials and coatings.

Further advantages arise from the dependent claims.

BRIEF DESCRIPTION OF THE DRAWINGS

Further characteristics and advantages of the invention shall emerge more clearly from the following detailed description when considered in connection with the attached drawings, wherein.

DESCRIPTION OF THE PREFERRED EMBODIMENTS

Figure 1:
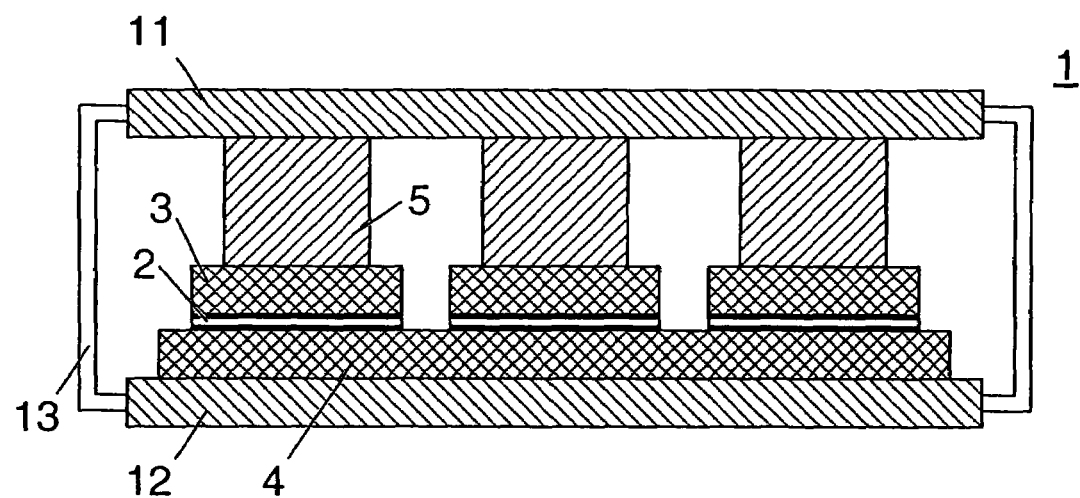
FIG. 1 schematically shows the high-power press pack semiconductor module according to the invention with a semiconductor device arranged between a top and a base plate.
Figure 2:
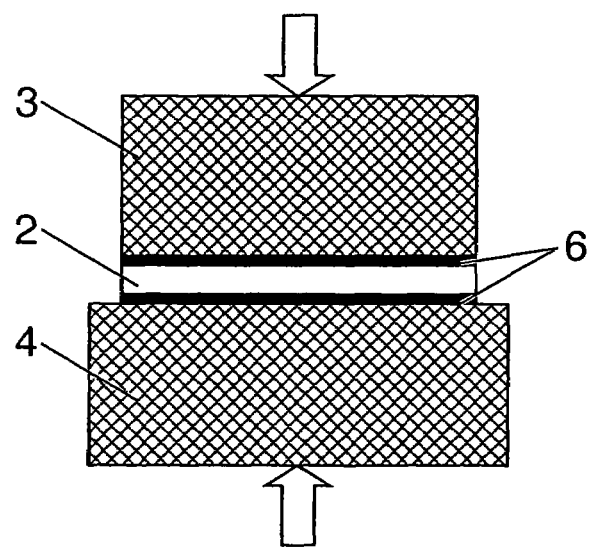
FIG. 2 shows an enlarged view of the semiconductor device arrangement of FIG. 1.

Referring now to the drawings, FIG. 1 shows a cross section through a preferred exemplary embodiment of a high-power press pack semiconductor module according to the invention. A number of individual Si semiconductor chips 2, e.g. IGBT or Diodes, are arranged isolated and alongside one another in a common housing. These chips are electrically connected in parallel, and the active semiconductor area required for high currents is in this way composed of a large number of individual surfaces. FIG. 1 does not show the normally bonded gate connections for actuating the semiconductor component.

The Si semiconductor chips 2 have a metallized main electrode on both the top face and bottom face, which make electrical contact with metallic contact surfaces. The chips are mounted on a conductive base plate 4 and a conductive top plate 3 is arranged directly above each chip. A contact piston 5 is pressing the top plate and the Si semiconductor chip against the base plate. The arrangement with contact piston, top plate, Si semiconductor chip and base plate is pressed between two module power connections 11 and 12 that are held together by electrically isolating housing elements 13. The pressure applied between the two module power connections is ensured to be adequate enough to flatten any bow resulting from manufacturing or processing conditions.

Base plate 4 and top plate 3 are made of a metal matrix composite material whose CTE can be tailored to a value either close to or matching that of Si semiconductor chip.

A great number of composites could be designed to match the CTE requirements and hence have adequate IOL compatibility. However, in order to have the required electrical conductivity, that will enable lower power dissipation due to current passage, the matrix should be metallic (i.e. Ag (Silver), Al (Aluminum), Cu (Copper) or Au (Gold)) while the reinforcement could be of any other type of material (non metallic, e.g. graphite, ceramic, e.g. SiC; or another metal as in Mo fibres or platelets embedded in a metallic matrix). Some examples of such metal matrix composites are Al-graphite, Cu-graphite, Cu—Mo, Al—SiC, Be-Beo. Conducting polymers, polymer composites and ceramics could also be an option. However given the SCFM requirement where the entire rated current of the stack is taken up by the short circuit formed by the hotspot alloy, metal matrix composites give rise to longer operating periods at higher power ratings. Composites with high metallic content that can easily alloy with the Si from the chip and form eutectics give rise to a more stable and longer operational time.

For the particular case of Al-graphite being used as the MMC material of choice, good SCFM performance is achieved with Si semiconductor chips being sandwiched between two Al-graphite plates comprising an Al matrix alloy with a Si content in the range of the eutectic composition. Al-graphite MMC material is commercially available with Si having been added during casting to improve the fluidity of the molten metal owing to the eutectic reaction and also in the case of Al-graphite castings to prevent the formation of the deleterious aluminum carbide and promote wetting of the graphite fibers.

The composition of the Al matrix alloy is designed to contain as low Si content as possible without affecting the castability, wettability of the graphite fibers and prevent the formation of the deleterious aluminum carbide. An example of such a matrix alloy that is commercially available is A356 (approximate composition 7% Si, 0.3% Mg and balance Al) that could be used for making the composite with graphite fibers. This composite provides improved SCFM performance compared to designs utilising Mo baseplates and Al or Ag top plates as stated in U.S. Pat. No. 6,426,561. Varying Si contents below the eutectic point in the matrix alloy would further improve SCFM performance with the lowest Si content being the best choice. Similar results are achieved with other composites like Ag-graphite in which the matrix metal is capable of alloying with Si.

The choice of Si composition in the matrix alloy depends on size and thickness of the Si semiconductor chip, and the electrical and thermal conductivities of the composite required in the module application as briefly explained below.

The primary damage event leading to short circuit failure mode is a short circuit in an individual semiconductor chip, after which the entire rated current flows through this chip. The sandwich structure comprising the semiconductor chip, the electrodes, top and base plates is heated until the elements in the matrix alloy form an electrically conducting alloy with the Si from the chip. The majority of this alloy is made up of Al and Si from the composite matrix and the Si from the semiconductor chip. When the resulting Si content in the hotspot is below the eutectic composition the Si is distributed in a fine form, which offers relatively lower resistance to current passage than in the case when the Si content of the hotspot alloy is high. For compositions in the hotspot with Si content higher than the eutectic composition, depending upon the prevailing temperature scenario in the hotspot due to power dissipation during operation, Si will precipitate out as bulk platelets. The higher the Si content in the hotspot alloy the greater is the resistance to current passage and the higher is the power dissipated leading to quicker aging of the alloy and oxidation due to prevailing high temperatures. Therefore higher Si contents in the composite matrix, especially above the eutectic composition of approximately 10-15 per cent, or even above 20 percent, result in lower SCFM lifetime while the lower Si contents provide a higher lifetime.

IOL performance will also improve because lowering the Si contents of the matrix alloy results in lower voltage drop compared to high Si content in the matrix and hence lower power dissipation during normal operation prior to SCFM.

The explanations above have not described the nature and internal structure of the semiconductor chips themselves. If, overall, the module represents an IGBT module, the internal structure corresponds to that of an IGBT or a diode, although the invention can also be applied to other semiconductor components like thyristors.

Obviously, numerous modification and variations of the present invention are possible in light of the above teachings. It is therefore to be understood that, within the scope of the appended claims, the invention may be practiced otherwise than as specifically described herein.

LIST OF REFERENCE SYMBOLS

1 Press pack module
2 Semiconductor device, chip
3 Composite top plate
4 Composite base plate
5 Contact piston
6 Bonding medium, solder
11, 12 Module housing power connections
13 Housing elements

The invention claimed is:

1. High-power press pack semiconductor module, comprising:
    an electrically conducting base plate;
    at least one electrically conducting top plate;
    a contact piston in pressing contact with the top plate:
    at least one semiconductor chip including semiconductor material, a first main electrode that makes contact with the base plate forming an interface and a second main electrode that makes contact with the top plate,
    a first module power connection in pressing contact with the base plate; and
    a second module power connection in pressing contact with the contact piston;
    wherein a material is provided adjacent at least one of said first or second main electrodes that, together with the semiconductor material forms a eutectic alloy or an alloy whose melting point is below that of the semiconductor material, and
    wherein at least one of said base plate or top plate is made of metal matrix composite material comprising two-dimensional randomly distributed short cut graphite fibers in the interface in an Al or Ag matrix, whose coefficient of thermal expansion is close to that of the semiconductor material, said metal matrix composite material containing said alloy-forming material.

2. Module as claimed in claim 1, wherein:
    said base plate and top plate are made of the same metal matrix composite material.

3. Module as claimed in claim 1, wherein:
    said metal matrix composite material has a metal content of at least 25 percent by volume.

4. Module as claimed in claim 3, wherein:
    said metal matrix composite material comprises a metallic matrix alloy with a semiconductor material.

5. High-power press pack semiconductor module comprising:
    an electrically conducting base plate;
    at least one electrically conducting top plate;
    at least one semiconductor chip including semiconductor material, a first main electrode that makes contact with the base plate forming an interface and a second main electrode that makes contact with the top plate,
    a contact piston in pressing contact with the top plate;
    a first module power connection in pressing contact with the base plate; and
    a second module power connection in pressing contact with the contact piston;
    wherein a material is provided adjacent at least one of said first or second main electrodes that, together with the semiconductor material forms a eutectic alloy or an alloy whose melting point is below that of the semiconductor material, and wherein
    at least one of said base plate or top plate is made of metal matrix composite material comprising of two-dimensional randomly distributed short cut graphite fibers in the interface in an Al or Ag matrix, whose coefficient of thermal expansion is close to that of the semiconductor material, said metal matrix composite material containing said alloy-forming material,
    said metal matrix composite material having a metal content of at least 25 percent by volume,
    said metal matrix composite material comprising a metallic matrix alloy with a semiconductor material, and
    said metallic matrix alloy having a semiconductor material content up to the semiconductor material content of a eutectic composition.

6. Module as claimed in claim 5, wherein:
    said matrix comprises Au or Cu with a Si content of at most 13 percent.

7. Module as claimed in claim 4, wherein:
    said metallic matrix alloy has a semiconductor material content that is tailored depending on the thickness of the semiconductor material such that the hotspot alloy is in the eutectic range without bulk precipitation.

8. Module as claimed in claim 1, wherein:
    said at least one plate of a metal matrix composite material has a thickness of at least the thickness of the semiconductor material.

9. Module as claimed in claim 1, wherein:
    said base plate and said top plate are both made of metal matrix composite material, and
    said plates have a combined thickness of at least the thickness of the semiconductor material.

* * * * *